United States Patent [19]

Kita

[11] Patent Number: 4,979,690
[45] Date of Patent: Dec. 25, 1990

[54] APPARATUS AND METHOD FOR WINDING UP MAGNETIC TAPES IN CASSETTES

[75] Inventor: Akihisa Kita, Odawara, Japan

[73] Assignee: Fuji Photo Film Co., Ltd., Kanagawa, Japan

[21] Appl. No.: 416,794

[22] Filed: Oct. 3, 1989

[30] Foreign Application Priority Data

Oct. 3, 1988 [JP] Japan ............................... 63-249675

[51] Int. Cl.$^5$ .......................................... B65H 19/20
[52] U.S. Cl. ............................ 242/67.1 R; 242/56 R; 414/798
[58] Field of Search ............... 242/67.1 R, 56 R, 58.6; 414/798, 798.1, 798.2, 797.9, 798.9; 211/268

[56] References Cited

U.S. PATENT DOCUMENTS

| | | | |
|---|---|---|---|
| 4,061,286 | 12/1977 | King, Sr. et al. | 242/58.4 X |
| 4,332,355 | 6/1982 | Zopfy et al. | 242/56 R |
| 4,415,301 | 11/1983 | Zielke | 414/798 X |
| 4,595,327 | 6/1986 | Woodley | 242/56 R X |

Primary Examiner—Stuart S. Levy
Assistant Examiner—Steven M. DuBois
Attorney, Agent, or Firm—Sughrue, Mion, Zinn, Macpeak & Seas

[57] ABSTRACT

An apparatus and method for winding up a magnetic tape in a cassette comprises first and second conveyance devices. The first conveyance device receives a cassette case, in which magnetic tape has not yet been wound up, at a receiving position, conveys the cassette case to a wind-up waiting position, at which said first conveyance means device provides the cassette case to the second conveyance device, and returns to the receiving position in order to receive a new cassette case in which magnetic tape has not yet been wound up. The second conveyance device conveys the cassette case to a wind-up position at which a magnetic tape is wound up in the cassette case. The second conveyance device then conveys the cassette case, in which the magnetic tape has been wound up, to the wind-up waiting position. Thereafter, the first conveyance device conveys the new cassette case, in which magnetic tape has not yet been wound up, to the wind-up waiting position and simultaneously pushes the previous cassette case out of the second conveyance device. Alternatively, the previous cassette case may be conveyed out of the second conveyance device due to gravity slightly before the new cassette case is conveyed to the wind-up waiting position.

16 Claims, 6 Drawing Sheets

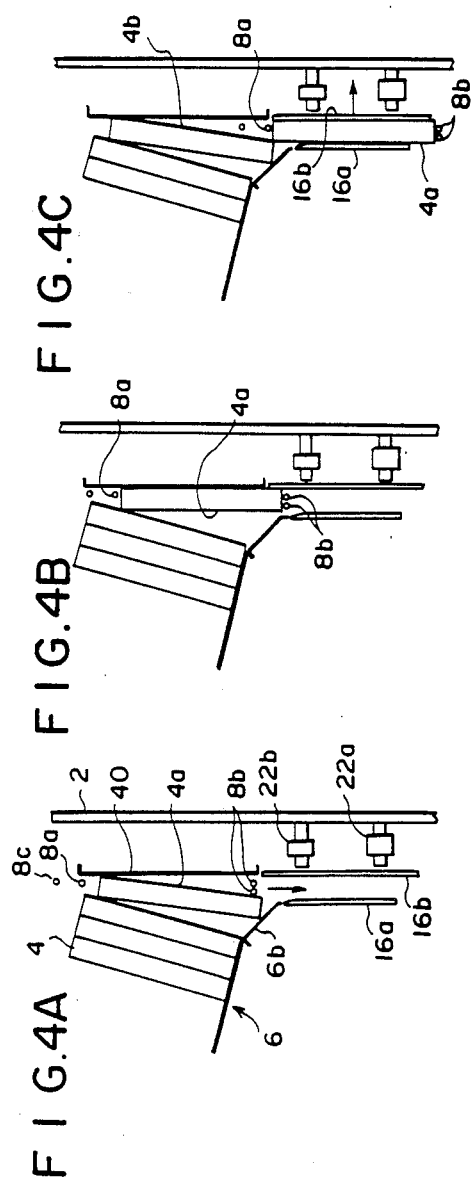
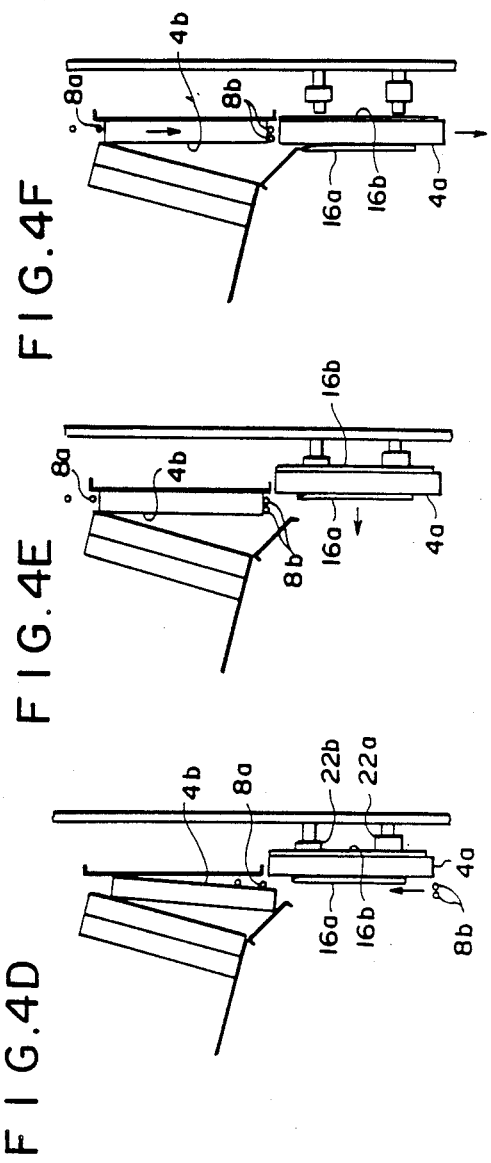

FIG.5A
FIG.5B
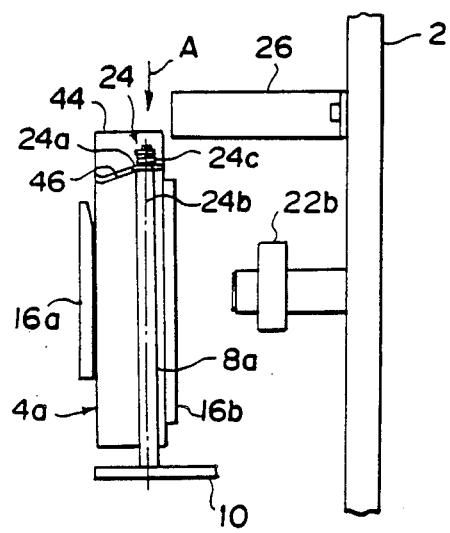
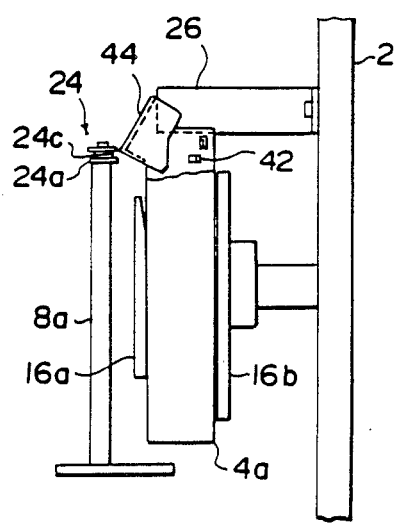

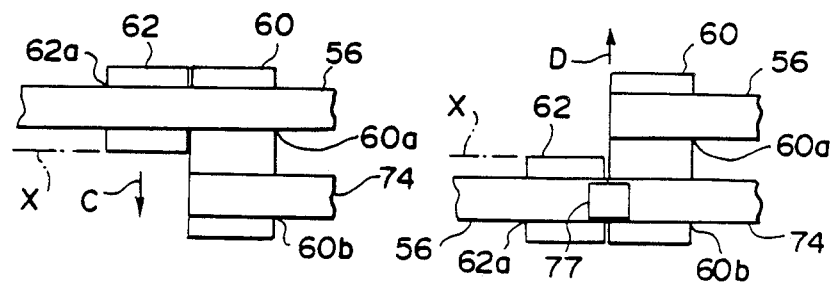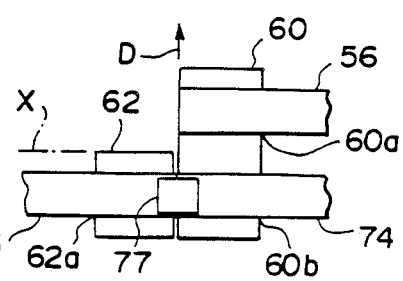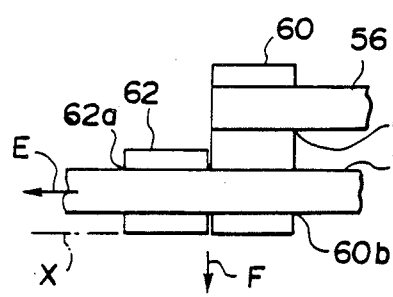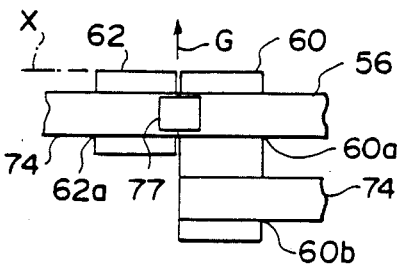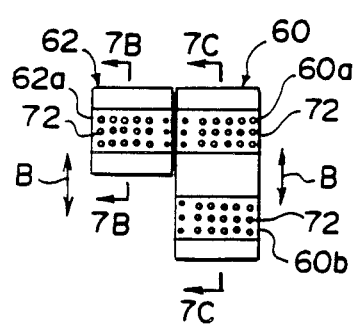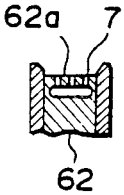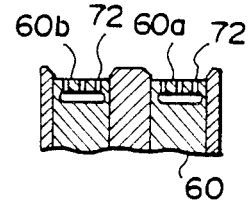

APPARATUS AND METHOD FOR WINDING UP MAGNETIC TAPES IN CASSETTES

BACKGROUND OF THE INVENTION

1. Field of the Invention

This invention relates to an apparatus for winding up a magnetic tape in a cassette wherein a plurality of cassette cases, each having a pair of reels to which both edges of a leader tape are connected, are conveyed one after another to a wind-up position, at which magnetic tape is wound up therein, and are then conveyed away from the wind-up position.

2. Description of the Prior Art

An apparatus for winding up magnetic tape in a cassette is disclosed in, for example, Japanese Unexamined Utility Model Publication No. 56(1981)-30479. The disclosed apparatus comprises a hopper for accommodating a plurality of cassette cases, each having a pair of reels, to which both edges of a leader tape are connected. The cassette cases are accommodated side by side in approximately upright orientations, and fall by gravity one after another from a cassette case outlet, which is formed at the lower edge of the hopper, into a movement path. A wind-up waiting position is located midway along the movement path. A moveable frame having a stop roller on its bottom part is located at the wind-up waiting position and receives a cassette case, which has fallen by gravity from the hopper, with the stop roller. Thereafter, the moveable frame moves in a direction approximately normal to the direction of the movement path in order to locate the cassette case at a wind-up position. At the wind-up position, a magnetic tape is wound up in the cassette case. The moveable frame then moves the cassette case, in which the magnetic tape has been wound up, to the wind-up waiting position in the movement path. At this position, the stop roller releases the cassette case. It then falls by gravity along the movement path and is discharged from the apparatus.

However, the disclosed apparatus for winding up a magnetic tape in a cassette has problems in that many processes must be carried out from the time when a cassette case, in which a magnetic tape has been wound up, is conveyed from the wind-up position to the time when a next cassette case is fed to the moveable frame. Therefore, a long cycle time is required to process each cassette case. Also, it is not always possible to feed a cassette case smoothly to the moveable frame.

Specifically, with the disclosed apparatus for winding up a magnetic tape in a cassette, between the time when a cassette case in which a magnetic tape has been wound up is conveyed from the wind-up position and the time when a next cassette case in which magnetic tape has not yet been wound up is fed to the moveable frame, it is necessary to move the cassette case, in which a magnetic tape has been wound up, from the wind-up position to the wind-up waiting position. Thereafter, the stop roller releases the cassette case, and it falls by gravity from the moveable frame and is discharged from the apparatus. A sensor detects that the cassette case has fallen to a position below the stop roller, and then the stop roller is set for receiving a next cassette case in which magnetic tape has not yet been wound up. Thereafter, the hopper allows the next cassette case to fall to the moveable frame. Accordingly, with the disclosed apparatus for winding up a magnetic tape in a cassette, the following five processes must be carried out from the time when a cassette case in which a magnetic tape has been wound up is conveyed from the wind-up position to the time when a next cassette case is fed to the moveable frame:

(1) a process for conveying the cassette case, in which the magnetic tape has been wound up, to the wind-up waiting position,
(2) a process for releasing the stop roller,
(3) a process for confirming that the cassette case, in which the magnetic tape has been wound up, has fallen to a position below the stop roller,
(4) a process for setting the stop roller for receiving a next cassette case in which magnetic tape has not yet been wound up, and
(5) a process for feeding a cassette case, in which magnetic tape has not yet been wound up, from the hopper to the moveable frame. As a result, processing each cassette case requires a long cycle time.

Also, with the disclosed apparatus for winding up a magnetic tape in a cassette, a cassette case falls by gravity when it is fed to the moveable frame. Because the cassette case, which is being fed to the moveable frame, has no magnetic tape wound up in it, it is very light in weight. Therefore, a problem that readily arises is that the cassette case tilts as it falls by gravity and gets caught in the movement path. As a result, the cassette case feeding operations stop.

SUMMARY OF THE INVENTION

The primary object of the present invention is to provide an apparatus for winding up a magnetic tape in a cassette, wherein the cycle time per cassette case is kept short.

Another object of the present invention is to provide an apparatus for winding up a magnetic tape in a cassette, wherein cassette cases, in which magnetic tape has not yet been wound up, are fed reliably to a moveable frame.

The present invention provides an apparatus for winding up a magnetic tape in a cassette wherein a plurality of cassette cases, each having a pair of reels to which both edges of a leader tape are connected, are conveyed one after another to a wind-up position, at which magnetic tape is wound up therein, and are then conveyed away from the wind-up position, the apparatus for winding up a magnetic tape in a cassette comprising:
(i) a first conveyance means which reciprocably moves between a cassette case receiving position and a wind-up waiting position, and
(ii) a second conveyance means which reciprocably moves between said wind-up waiting position and said wind-up position, wherein said first conveyance means receives a cassette case, in which magnetic tape has not yet been wound up, at said cassette case receiving position, conveys said cassette case to said wind-up waiting position at which said first conveyance means causes said cassette case to become associated with said second conveyance means which is located at said wind-up waiting position, and thereafter returns to said cassette case receiving position in order to receive a new cassette case in which magnetic tape has not yet been wound up, said second conveyance means conveys said cassette case, which was associated therewith at said wind-up waiting position by the action of said first conveyance means, to said wind-up position, at which magnetic tape is wound up therein, and thereafter conveys said cassette case to said wind-up waiting position, and said first conveyance means thereafter conveys said new cassette case, in which magnetic tape has not yet been wound up, to said wind-up waiting position, at which said first conveyance means causes said new cassette case to become associated with said second conveyance means which is now located at said wind-up waiting position, and pushes said previous cassette case, in which magnetic tape has been wound up and which is associated with said second conveyance means, out of said second conveyance means through an operation wherein said first conveyance means causes said new cassette case to become associated with said second conveyance means.

The first conveyance means may be of any type insofar as it receives a cassette case, in which magnetic tape has not yet been wound up, at the cassette case receiving position and forcibly conveys the cassette case to the wind up waiting position, at which said first conveyance means causes the cassette case to become associated with the second conveyance means which is located at the wind-up waiting position, so that the second conveyance means can convey the cassette case from the wind-up waiting position to the wind-up position. After the cassette case has thus become associated with the second conveyance means, or after the cassette case has been conveyed by the second conveyance means to the position at which it leaves the first conveyance means, the first conveyance means returns to the cassette case receiving position in order to receive a new cassette case in which magnetic tape has not yet been wound up.

The second conveyance means may be of any type insofar as it conveys the cassette case, which has become associated therewith at the wind-up waiting position by the action of the first conveyance means, to the wind-up position, at which a magnetic tape is wound up in the cassette case, and thereafter conveys the cassette case, which has magnetic tape wound up therein, to the wind-up waiting position. However, the second conveyance means should be associated with the cassette case in such a way, that when the second conveyance means has conveyed the cassette case, in which the magnetic tape has been wound up, to the wind-up waiting position, said cassette case can at least be pushed out of the second conveyance means through an operation whereby the first conveyance means causes a new cassette case, in which no magnetic tape has been wound up, to become associated with the second conveyance means. The term "at least be pushed out" embraces cases where the cassette case falls by gravity before it is pushed out of the second conveyance means by the first conveyance means. In such cases, the cassette case should become associated with the second conveyance means in such a way that it can be pushed out of the second conveyance means if it remains therein.

Also, the second conveyance means may have the function of holding the cassette case so that it does not fall by gravity, or it may be constructed in such a way that it allows the cassette case to fall out of itself by the force of gravity. In cases where the second conveyance means should have the function of holding the cassette case so that it does not fall by gravity, the second conveyance means may be constituted such that it holds the cassette case by, for example, a resilient force, whereby the cassette case is pushed out and the resilient force is overcome when the first conveyance means causes a new cassette case, in which magnetic tape has not yet been wound up, to become associated with the second conveyance means. In cases where the second conveyance means does not have the function of holding the cassette case so that it does not fall by gravity, the cassette case associated with the second conveyance means at the wind-up waiting position should be held by, for example, the first conveyance means. In such cases, when the cassette case has been conveyed by the second conveyance means toward the wind-up position, at which the cassette case leaves the first conveyance means, reels of the cassette case should engage with and be held by reel drive shafts located at the wind-up position. Alternatively, the cassette case should continue to be associated with the second conveyance means until the reels of the cassette case engage with the reel drive shafts.

With the apparatus for winding up a magnetic tape in a cassette in accordance with the present invention, the first conveyance means forcibly conveys a new cassette case, in which magnetic tape has not yet been wound up, to the wind-up waiting position, and causes the cassette case to become associated with the second conveyance means, which is located at the wind-up waiting position. At this time, the previous cassette case, in which a magnetic tape has been wound up and which was associated with the second conveyance means, is pushed out of the second conveyance means through an operation whereby the first conveyance means causes the new cassette case to become associated with the second conveyance means. Therefore, from the time when a cassette case in which a magnetic tape has been wound up is conveyed from the wind-up position to the time when a new cassette case, in which magnetic tape has not yet been wound up, is fed to the second conveyance means, only the following two processes are carried out:

(1) a process wherein the second conveyance means conveys the cassette case, in which the magnetic tape has been wound up, to the wind-up waiting position, and (2) a process wherein the first conveyance means conveys the new cassette case, in which magnetic tape has not yet been wound up, to the wind-up waiting position (the cassette case in which the magnetic tape has been wound up being simultaneously conveyed out of the second conveyance means). Accordingly, the cycle time required to process each cassette case is kept markedly short.

Also, feeding of a new cassette case, in which magnetic tape has not yet been wound up, to the second conveyance means, which is located at the wind-up waiting position, is forcibly carried out by the first conveyance means. Therefore, cassette cases can be fed reliably.

BRIEF DESCRIPTION OF THE DRAWINGS

FIGS. 5A and 5B are plan views showing how the lock of a guard panel of a cassette case is released and the guard panel is opened, FIGS. 6A through 6D are schematic views taken from the direction indicated by the arrow VI of FIG. 2 and showing how a leader tape is joined with a magnetic tape, FIG. 7A is a schematic view similar to FIG. 6A but with the leader tape and the magnetic tape omitted, and FIG. 7B is a sectional view taken along line 7B—7B of FIG. 7A, and FIG. 7C is a sectional view taken along line 7C—7C of FIG. 7A.

DESCRIPTION OF THE PREFERRED EMBODIMENTS

The present invention will hereinbelow be described in further detail with reference to the accompanying drawings.

Figure 1:
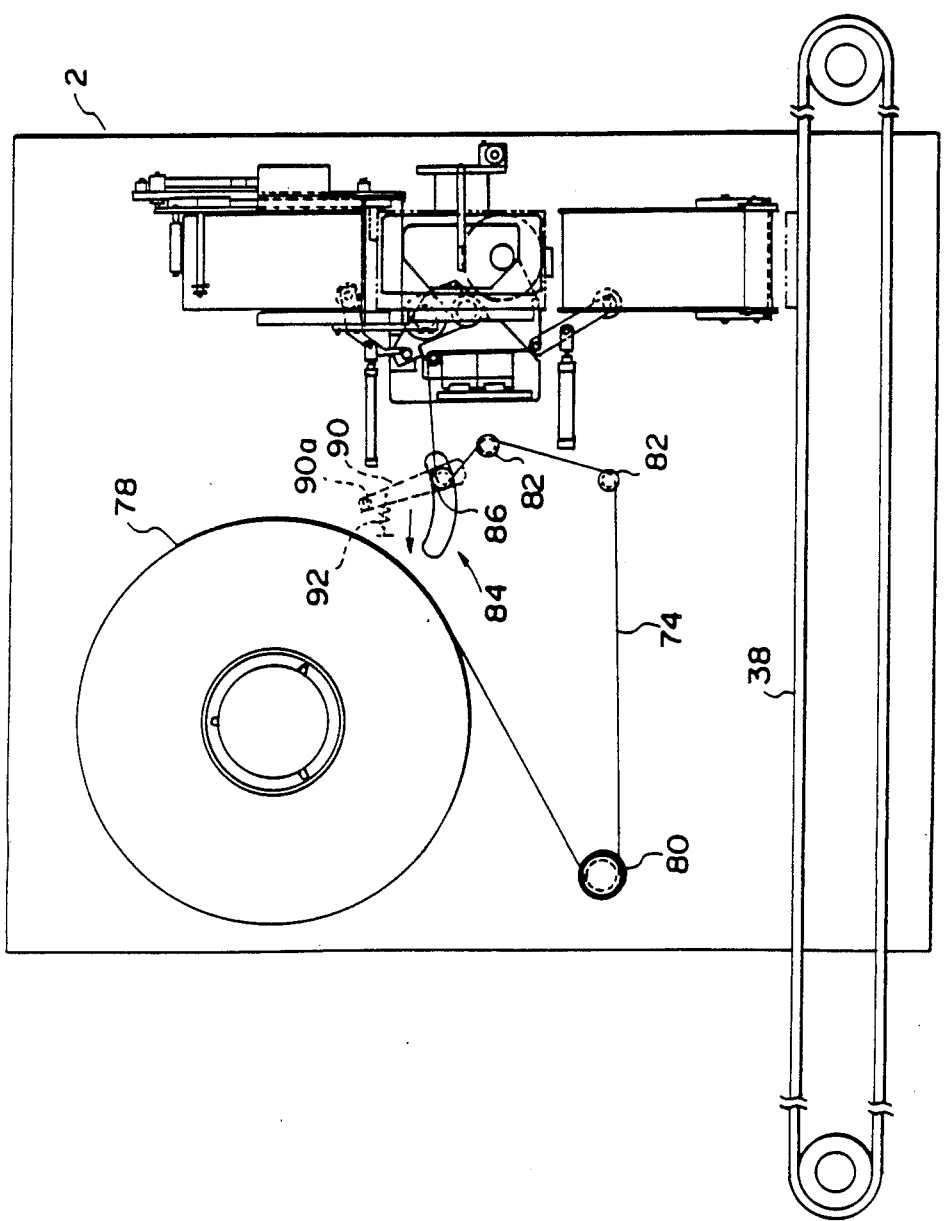
FIG. 1 is a schematic front view showing an embodiment of the apparatus for winding up a magnetic tape in a cassette in accordance with the present invention.
Figure 2:
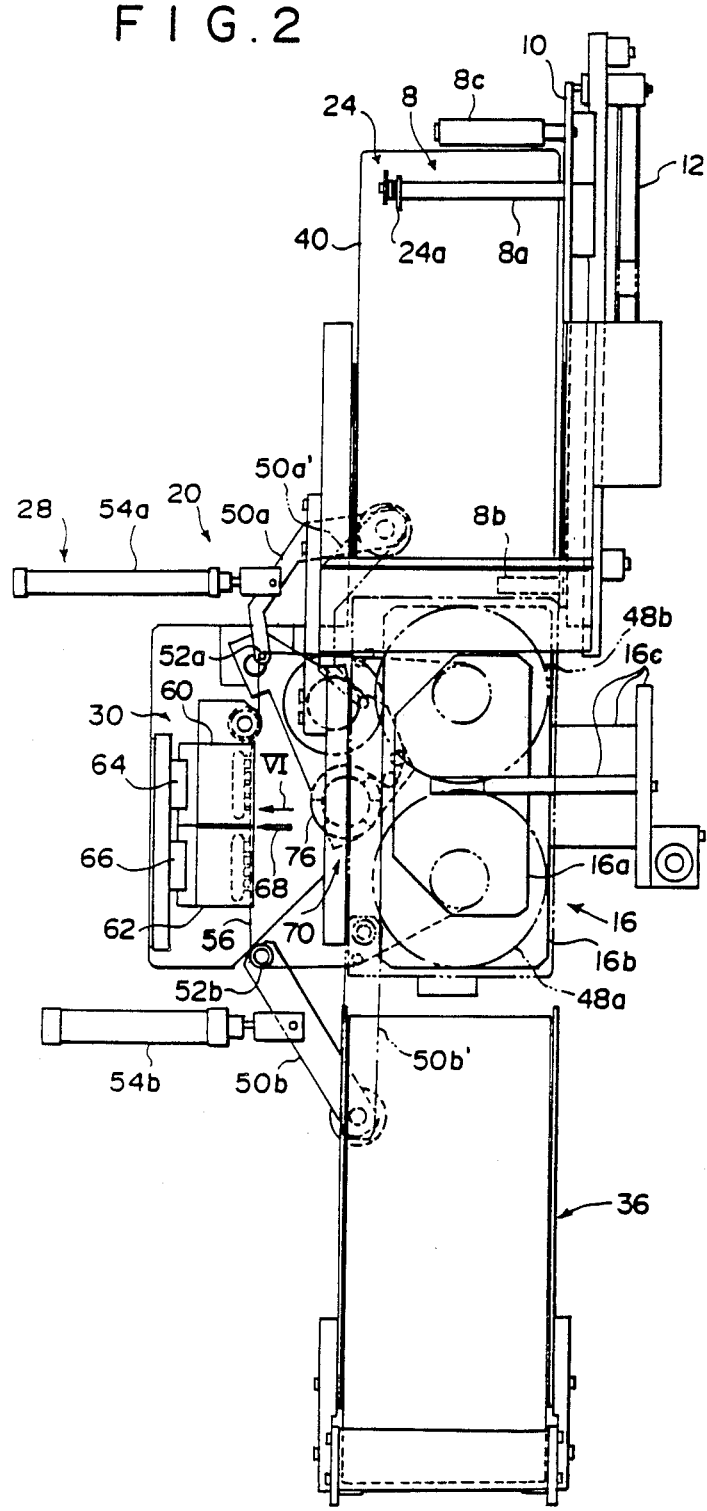
FIG. 2 is an enlarged front view showing a major part of the embodiment shown in FIG. 1.

FIG. 1 is a schematic front view showing an embodiment of the apparatus for winding up a magnetic tape in a cassette in accordance with the present invention; FIG. 2 is an enlarged front view showing a major part of the embodiment shown in FIG. 1; and FIG. 3 is an enlarged right side view showing a major part of the embodiment shown in FIG. 1.

Figure 3:
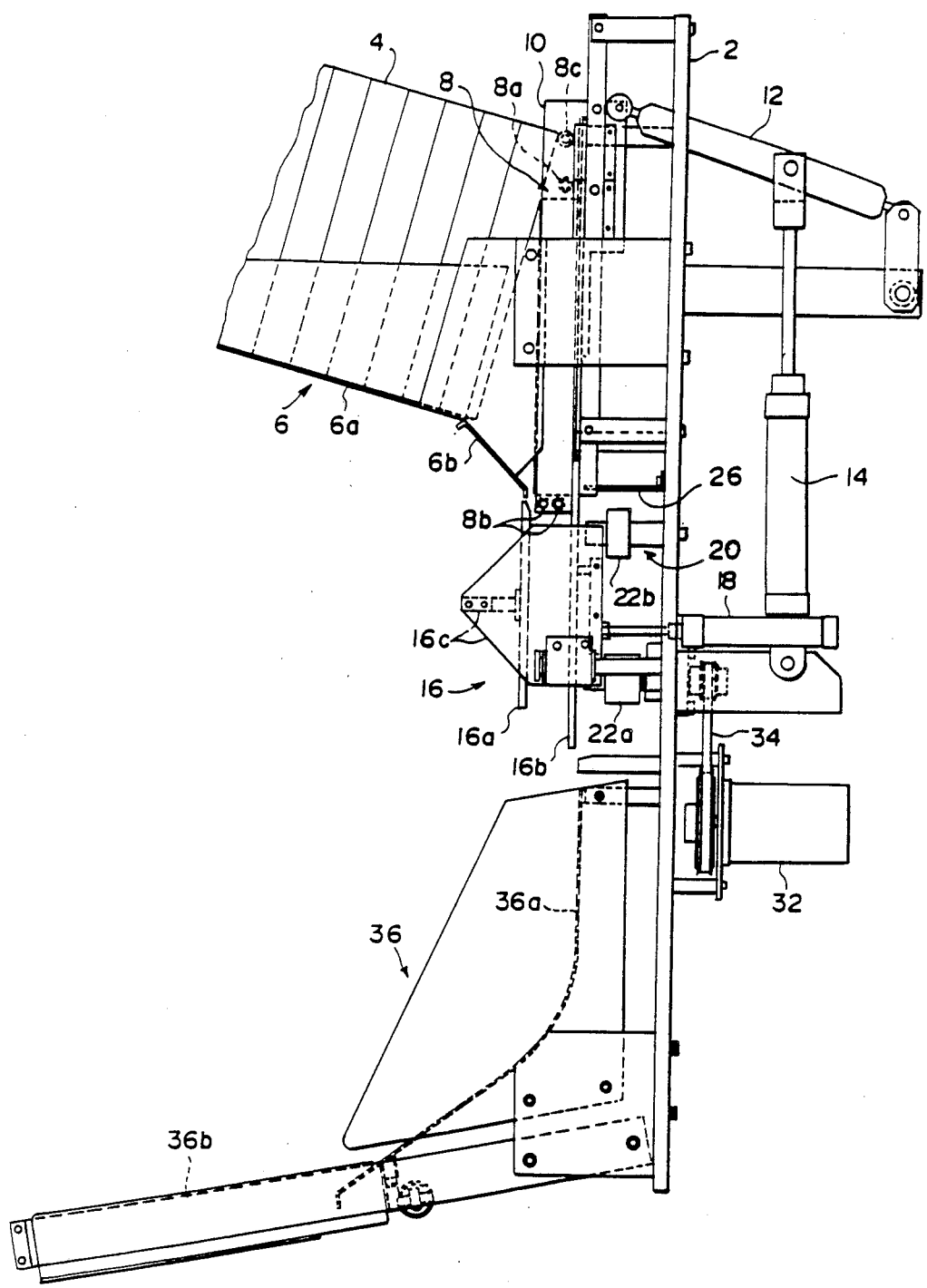
FIG. 3 is an enlarged right side view showing a major part of the/embodiment shown in FIG. 1, FIGS. 4A through 4F are schematic side views sequentially showing the steps for conveying cassette cases.

As shown in FIG. 3, a hopper 6 is located at the upper front part in a panel 2. The hopper 6 accommodates a plurality of cassette cases 4, . . . of video magnetic tape cassettes in which magnetic tapes are to be wound up. The cassette cases 4, . . . are located side by side at slightly inclined (approximately upright) orientations. A pair of reels 48a and 48b (shown in FIG. 2), to which both edges of a leader tape have been connected, are accommodated in each of the cassette cases 4, . . .

A first conveyance means 8 is located in the panel 2. The first conveyance means 8 is comprised of a guide pin 8a and guide bars 8b which grasp a cassette case 4 from above and below, respectively. The guide pin 8a and the guide bars 8b are supported on a support plate 10. The support plate 10 is connected to a link member 12 which is in turn connected to an air cylinder 14. The link member 12 and the support plate 10 are moved by the air cylinder 14, so that the guide pin 8a and the guide bars 8b which together comprise the first conveyance means 8, move reciprocably and vertically between an upper position, i.e. a cassette case receiving position, and a lower position, i.e. a wind-up waiting position, along the panel 2. The support plate 10 also supports a guide pin 8c which is located above the guide pin 8a.

At the cassette case receiving position, the first conveyance means 8 receives the lowest cassette case 4 from the hopper 6, the cassette case 4 being grasped by the guide pin 8a and the guide bars 8b. In this embodiment, the cassette case receiving position ranges from the position of the first conveyance means 8 shown in FIG. 3 to a position slightly above that position. At the wind-up waiting position, the cassette case 4 is provided to a second conveyance means 16 which will be described later. After the cassette case 4 is located at the wind-up waiting position, it is conveyed by the second conveyance means 16 to a wind-up position. In this embodiment, the first conveyance means 8 moves down to the wind-up waiting position, which is a predetermined distance from the position shown in FIG. 3. At the wind-up waiting position the cassette case 4 is placed between front keep plate 16a and the rear keep plate 16b of the second conveyance means 16.

As shown in FIG. 3, in this embodiment, a bottom plate 6a of the hopper 6 is inclined so that the side of the hopper 6 facing the first conveyance means 8, which is located at the cassette case receiving position, is lower than the other side. Each cassette case 4 is held in the hopper 6 in an approximately upright orientation so that the bottom surface of the cassette case 4 (at which bottom surface the reel engagement holes are laid bare) faces the first conveyance means 8, which is located at the cassette case receiving position, and the upper side of the cassette case 4 in FIG. 3 is closer to the first conveyance means 8 than is the lower side. A slant guide plate 6b, which is inclined at a larger angle than the bottom plate 6a, is located between the bottom plate 6a and the guide bars 8b of the first conveyance means 8 located at the cassette case receiving position. When the first conveyance means 8 is located at the cassette case receiving position, the lowest cassette case 4 readily slides along the slant guide plate 6b and becomes located between the guide pin 8a and the guide bars 8b.

The second conveyance means 16 is located in the panel 2. The second conveyance means 16 is comprised of the front keep plate 16a and the rear keep plate 16b, which are coupled together by a coupling member 16c and spaced from each other by a distance slightly larger than the thickness of the cassette case 4. The rear keep plate 16b is connected to an air cylinder 18, which reciprocably moves the second conveyance means 16 in the horizontal direction between the left position shown in FIG. 3, i.e. the wind-up waiting position, and a right position, i.e. the wind-up position.

At the wind-up position, a wind-up means 20 winds up a magnetic tape in the cassette case 4. In this embodiment, the second conveyance means 16 conveys the cassette case 4 a predetermined distance to the right in FIG. 3, which moves it from the wind-up waiting position to the wind-up position. At the wind-up position the two reel engagement holes, which are laid bare in the bottom surface of the cassette case 4, are engaged with a drive shaft 22a and a drive shaft 22b of the wind-up means 20.

The panel 2 is provided with the wind-up means 20. The wind-up means 20 comprises the drive shaft 22a, which engages with the engagement hole of the reel 48a of the cassette case 4 and rotates the reel 48a, and the drive shaft 22b, which engages with the engagement hole of the reel 48b of the cassette case 4 and can rotate freely. The wind-up means 20 also comprises a lock release mechanism which releases the lock of a front guard panel of the cassette case 4, a guard panel opening mechanism 26 which opens the front guard panel, a leader tape pull-out mechanism 28 which pulls the leader tape out of the cassette case 4, and a splicing means 30 which splices the leader tape with the magnetic tape. The wind-up means 20 will be described later in more detail. The drive shaft 22a is connected to a drive motor 32 by a belt 34.

A feed-out mechanism 36 is located below the second conveyance means 16, which is located at the wind-up waiting position. The feed-out mechanism 36 receives the cassette case 4 in which the magnetic tape has been wound up and which has fallen from the second conveyance means 16 located at the wind-up waiting position. The feed-out mechanism 36 changes the orientation of the cassette case 4, in which the magnetic tape has been wound up, from an upright orientation to an approximately horizontal orientation and discharges the cassette case 4 downwardly. A belt conveyor 38 is located below the feed-out mechanism 36.

How the aforesaid embodiment operates will be described hereinbelow with reference to FIGS. 4A through 4F. FIGS. 4A through 4F simply show the operations which are performed by the apparatus shown in FIG. 3.

First, as shown in FIG. 4A, the guide pin 8a and the guide bars 8b, which together comprise the first conveyance means 8, are located at the top part of the cassette case receiving position. At this time, the lowest cassette case 4a in the hopper 6 is located such that the lower edge of the top surface (i.e. the left surface in FIG. 4A) is in contact with the slant guide plate 6b, the part adjacent to the lower edge of the bottom surface (i.e. the right surface in FIG. 4A) is in contact with one of the guide bars 8b, and the upper edge of the bottom surface is in contact with a stop plate 40 which is secured to the panel 2.

The position, at which the lowest cassette case 4a is to be received by the guide pin 8a and the guide bars 8b waits at the hopper 6 as described above, is referred to as a waiting position at the hopper 6.

Thereafter, as shown in FIG. 4B, the guide pin 8a and the guide bars 8b move down a predetermined distance to the lowest part of the cassette case receiving position. As a result, the cassette case 4a, which is located at the waiting position at the hopper 6 as shown in FIG. 4A, moves by gravity into the space between the guide pin 8a and the guide bars 8b and is grasped thereby as shown in FIG. 4B. As shown in FIG. 4C, the guide pin 8a and the guide bars 8b move down even further to the wind-up waiting position, at which the cassette case 4a is inserted into the space between the front keep plate 16a and the rear keep plate 16b, which together comprise the second conveyance means 16 and which are located at the wind-up waiting position. In this manner, the cassette case 4a becomes associated with the front keep plate 16a and the rear keep plate 16b. Thereafter, the front keep plate 16a and the rear keep plate 16b move to the right, as indicated by the arrow in FIG. 4C, until they reach the wind-up position shown in FIG. 4D. As a result, as shown in FIG. 4D, the cassette case 4a engages with the drive shaft 22a and the driven shaft 22b, which constitute part of the wind-up means 20. Specifically, the engagement holes of the reels which holes are laid bare in the bottom surface of the cassette case 4a engage with the drive shaft 22a and the driven shaft 22b.

As shown in FIGS. 4C and 4D, when the cassette case 4a is conveyed downwardly by the guide pin 8a and the guide bars 8b, the next cassette case 4b is located with the help of gravity at the waiting position at the hopper 6. Also, basically, the front keep plate 16a and the rear keep plate 16b do not have the function of holding the cassette case 4a so that it will not fall under the force of gravity. When the cassette case 4a is located at the wind-up waiting position as shown in FIG. 4C, the cassette case 4a is supported by the guide pin 8a and the guide bars 8b, particularly by the guide bars 8b. The cassette case 4a is conveyed by the front keep plate 16a and the rear keep plate 16b to the right toward the wind-up position, at which it leaves the guide bars 8b. By the time the cassette case 4a has left the guide bars 8b, it has already been engaged with the drive shaft 22a and the driven shaft 22b and is held thereby.

As shown in FIG. 4D, after the cassette case 4a is conveyed by the front keep plate 16a and the rear keep plate 16b to the wind-up position and leaves the guide pin 8a and the guide bars 8b, the guide pin 8a and the guide bars 8b move up and return to the cassette case receiving position. At this time, one of the guide bars 8b comes into contact with the next cassette case 4b and raises it slightly. Accordingly, as shown in FIG. 4E, the cassette case 4b moves slightly because of gravity and is grasped by the guide pin 8a and At the wind-up position shown in FIG. 4D, a magnetic tape is wound up in the cassette case 4a by the wind-up means 20 as will be described later in detail.

When the magnetic tape has been wound up in the cassette case 4a, the cassette case 4a in which the magnetic tape has been wound up is conveyed by the front keep plate 16a and the rear keep plate 16b leftwardly from the position shown in FIG. 4E, and is located at the wind-up waiting position as shown in FIG. 4F. The guide pin 8a and the guide bars 8b then move down in order to convey the next cassette case 4b to the wind-up waiting position, at which it becomes associated with the front keep plate 16a and the rear keep plate 16b. Also, as the guide pin 8a and the guide bars 8b move down in order to cause the cassette case 4b to become associated with the front keep plate 16a and the rear keep plate 16b, the cassette case 4a, in which the magnetic tape has been wound up and which has become associated with the front keep plate 16a and the rear keep plate 16b, is pushed down by the guide bars 8b. In this manner, the cassette case 4b becomes associated with the front keep plate 16a and the rear keep plate 16b in the same manner as the cassette case 4a shown in FIG. 4C, and the operations described above are then repeated.

The cassette case 4a, in which the magnetic tape has been wound up and which has been pushed down and out of the space between the front keep plate 16a and the rear keep plate 16b, falls because of gravity along a bent guide plate 36a of the feed-out mechanism 36 shown in FIG. 3, and the orientation of the cassette case 4a is changed as it falls from an approximately upright one to an approximately horizontal one. The cassette case 4a is received by an approximately horizontal guide plate 36b and slides thereon to the belt conveyor 38 shown in FIG. 1.

Basically, the cassette case 4a, which is located between the front keep plate 16a and the rear keep plate 16b as shown in FIG. 4F, is situated such that gravity can act upon it. Therefore, gravity acts upon the cassette case 4a simultaneously with the guide bars 8b, which push it down and out of the space between the front keep plate 16a and the rear keep plate 16b. In this embodiment, a non-slip tape is adhered to the bottom surface of each cassette case 4 in order to reduce shocks experienced by the cassette case 4 as it falls by gravity. Therefore, the cassette case 4a, which is located as shown in FIG. 4F, does not immediately fall by gravity but is pushed down by the guide bars 8b before falling by gravity.

How the magnetic tape is wound up in the cassette case 4a will be described hereinbelow.

At the wind-up position, the guard panel lock of the cassette case 4a is released, and the guard panel is opened. The leader tape is then pulled out of the cassette case 4a and spliced with the magnetic tape, and the magnetic tape is wound around one of the reels.

How the lock of the guard panel is released and the guard panel is opened will be described below with reference to FIGS. 5A and 5B. With reference to FIG. 5A, the cassette case 4a has been conveyed by the guide pin 8a and the guide bars 8b, 8b (only the guide pin 8a is shown in FIG. 5A) to the wind-up waiting position, where it has become associated with the front keep plate 16a and the rear keep plate 16b. At this time, the lock release mechanism 24, which is provided at an edge of the guide pin 8a, pushes a guard panel lock lever 42 (shown in FIG. 5B) of the cassette case 4a, which releases the lock of a guard panel 44. Specifically, the lock release mechanism 24 comprises a lock release pin 24a, and a spring 24c which urges the lock release pin 24a to rotate in a counterclockwise direction around an axis 24b, as viewed from the direction indicated by the arrow A. In the state shown in FIG. 5A, the lock release pin 24a pushes the lock lever 42, which releases the lock of the guard panel 44. Thereafter, the front keep plate 16a and the rear keep plate 16b convey the cassette case 4a rightwardly to the wind-up position. The guard panel opening mechanism 26, which takes on the form of an opening piece, is secured to the panel 2 so that it interferes with the guard panel 44 when the cassette case 4a is conveyed to the wind-up position. As the cassette case 4a is conveyed to the wind-up position, the guard panel opening mechanism 26 pushes the guard panel 44 up. As shown in FIG. 5B, when the cassette case 4a is located at the wind-up position, the guard panel 44 is opened.

When in the state of FIG. 5A, the lock release pin 24a projects into a groove 46, which is defined between the guard panel 44 and the cassette case body. If the lock release pin 24a were fixed, it would interfere with the guard panel 44 when the cassette case 4a is conveyed to the wind-up position. However, in this embodiment, the lock release pin 24a can rotate around the axis 24b. Therefore, when the cassette case 4a is conveyed to the wind-up position, the guard panel 44 pushes the lock release pin 24a and overcomes the force of the spring 24c. The lock release pin 24a then rotates in a clockwise direction as viewed from the direction indicated by the arrow A in FIG. 5A, which ensures that it will not interfere with the guard panel 44.

How the leader tape is pulled out of the cassette case 4a will be described hereinbelow. As shown in FIG. 2, the leader tape pull-out mechanism 28 comprises pull-out arms 50a and 50b, pull-out pins 52a and 52b respectively secured to the pull-out arms 50a and 50b, and air cylinders 54a and 54b, which respectively move the pull-out arms 50a and 50b. Before the cassette case 4a is conveyed to the wind-up position, the pull-out arms 50a and 50b are located at the positions 50a' and 50b' indicated by the chained lines in FIG. 2. Therefore, when the cassette case 4a has been conveyed to the wind-up position, the pull-out pins 52a and 52b enter an opening formed in the bottom surface of the cassette case 4a, after which they are located on the rear side of a leader tape 56. When the cassette case 4a is located at the wind-up position, the guard panel 44 is opened as described above. The air cylinders 54a and 54b then rotate the pull out arms 50a and 50b to the positions indicated by the solid lines in FIG. 2. As a result, as shown in FIG. 2, the leader tape 56 is pulled out of the cassette case 4a to a position close to joining bases 60 and 62 of the splicing means 30.

How the leader tape 56 is joined to the cassette case will be described hereinbelow. The joining is carried out by the splicing means 30. The splicing means 30 comprises the joining bases 60 and 62, sliding mechanisms 64 and 66 which move the joining bases 60 and 62, a tape cutter 68, and a splicing tape adhering mechanism 70. FIG. 6A is a view taken from the direction indicated by the arrow VI in FIG. 2. FIG. 7A shows only the joining bases 60 and 62 of FIG. 6A. FIG. 7B is a sectional view taken along line 7B—7B of FIG. 7A, and FIG. 7B is a sectional view taken along line 7C—7C of FIG. 7A. As shown in FIGS. 7A, 7B and 7C, grooves 60a and 60b are formed on the joining base 60, and a single groove 62a is formed on the joining base 62. Suction holes 72, 72, . . . are formed in each of the grooves 60a, 60b and 62a and are connected to a suction device (not shown). Also, the sliding mechanisms 64 and 66 respectively move the joining bases 60 and 62 in the directions indicated by the double headed arrows B, B in FIG. 7A.

After the leader tape 56 has been pulled to a position close to the joining bases 60 and 62 at the wind-up position, the joining bases 60 and 62 are located as shown in FIG. 6A. The leader tape 56 is located in the vicinity of the surfaces of the grooves 60a and 62a, and is sucked to their surfaces by the suction force exerted through the suction holes 72 . . . Also, an end part of a magnetic tape 74 is pulled out of a tape reel, the process by which it is pulled out to be described later, and sucked into the groove 60b of the joining base 60. In FIG. 6A, the chained line X is a reference line for the positions of the joining bases 60 and 62. Thereafter, the aforesaid tape cutter 68 moves between the joining bases 60 and 62 in order to cut the leader tape 56. The joining base 62 to which one of the cut edge parts of the leader tape 56 is sucked, slides in the direction indicated by the arrow C in FIG. 6A until the groove 62a aligns with the groove 60b as shown in FIG. 6B. In this manner, the edge of the leader tape 56, which has been sucked into the groove 62a, and the edge of the magnetic tape 74, which has been sucked into the groove 60b, are located in abutment with each other.

When the joining base 62 has been moved until the edge of the leader tape 56 and the edge of the magnetic tape 74 are located in abutment with each other, these edges face a splicing roller 76 of the splicing tape adhering mechanism 70. Thereafter, as shown in FIG. 6B, a splicing tape piece 77 is adhered to these edges by the splicing roller 76 in order that the edges may be joined together. The joining bases 60 and 62 then move in the direction indicated by the arrow D in FIG. 6B while the relationship between their positions is kept unchanged. In this manner, the joining bases 60 and 62 are located at the positions with respect to the reference line X as shown in FIG. 6C.

Thereafter, the tape ceases to be sucked into the grooves 60b and 62a, and the drive motor 32 shown in FIG. 3 rotates the reel 48a, which engages with the drive shaft 22a, via the belt 34 and the drive shaft 22a. Therefore, the magnetic tape 74 joined to the edge of the leader tape 56 is moved in the direction indicated by the arrow E in FIG. 6C and wound around the reel 48a. As shown in FIG. 1, the edge part of the magnetic tape 74 has been pulled out of a tape roll wound around a tape reel 78 via a counting roller 80, a guide roller 82, and a tension imparting means 84. The magnetic tape 74 is fed from the tape roll and wound around the reel 48a. A predetermined tension is kept on the part of the magnetic tape 74 being fed from the tape roll by the tension imparting means 84. The tension imparting means 84 comprises a roller 86 over which the magnetic tape 74 is threaded, an arm 90 which supports the roller 86 and which can rotate around a support point 90a, and a spring 92 which pulls the arm 90 in the direction indicated by the arrow. The spring 92 puts tension on the magnetic tape 74.

When a predetermined length of the magnetic tape 74 has been wound around the reel 48a, the drive motor 32 is stopped so that the tape winding operation can be finished. Thereafter, in FIG. 6C, the magnetic tape 74 is sucked into the grooves 60b and 62a, and the tape cutter 68 moves between the joining bases 60 and 62 in order to cut the magnetic tape 74. The sliding mechanisms 64 and 66 then move the joining bases 60 and 62 in the direction indicated by the arrow F until the grooves 60a and 62a align with each other and the joining bases 60 and 62 are located at the positions with respect to the reference line X shown in FIG. 6D. In this condition, the cut edge of the magnetic tape 74, which has been sucked into the groove 62a, and the other edge of the leader tape 56, which has been sucked into the groove 60a, are located in abutment with each other. A splicing tape piece 77 is then adhered to these edges by the splicing roller 76 in order that the magnetic tape 74 may be joined to the leader tape 56.

Thereafter, the sliding mechanisms 64 and 66 move the joining bases 60 and 62 in the direction indicated by the arrow G in FIG. 6D until they are located at the positions shown in FIG. 6A. The tape ceases to be sucked into the grooves 60a and 62a, and the pull-out arms 50a and 50b shown in FIG. 2 are rotated respectively to the positions 50a' and 50b' indicated by the chained lines in FIG. 2. The drive motor 32 winds the portions of the magnetic tape and the leader tape, which remain in a loop form on the outward side of the cassette case 4a, into the cassette case 4a. In this manner wind-up of the magnetic tape is completed.

The splicing tape adhering mechanism 70 may be of the same type as those disclosed in, for example, Japanese patent Publication No. 60(1985)-45096 and Japanese Unexamined patent Publication No. 52(1977)-79907.

After the magnetic tape has been wound up in the cassette case 4a in the manner described above, the front keep plate 16a and the rear keep plate 16b convey the cassette case 4a from the wind-up position to the wind-up waiting position. As the cassette case 4a is conveyed, the guard panel 44 is closed, and the cassette case 4a is pushed down and out of the wind-up waiting position by the guide bars 8b.

I claim:

1. An apparatus for winding up a magnetic tape in a plurality of cassette cases which each have a pair of reels to which edges of a leader tape are connected, said apparatus comprising:
    a first conveyance means for conveying said cassette cases in which no magnetic tape has been wound one at a time to a wind-up waiting position;
    a second conveyance means for conveying said cassette cases provided by said first conveyance means between said wind-up waiting position and a wind-up position; and
    means for winding magnetic tape into said cassette cases at said wind-up position;
    wherein said second conveyance means returns said cassette cases having magnetic tape wound therein by said winding means to said wind-up waiting position and wherein a cassette case in which a magnetic tape has been wound by said winding means and returned to said wind-up waiting position is conveyed out of said wind-up waiting position substantially simultaneously with conveyance by said first conveyance means of a next cassette case in which magnetic tape has not yet been wound to said wind-up waiting position.

2. An apparatus as defined in claim 1 wherein said first conveyance means comprises a guide pin and bars which are supported on a common support plate and which grasp the cassette case in which magnetic tape has not yet been wound in order to convey the cassette case to said wind-up waiting position.

3. An apparatus as defined in claim 1 wherein said second conveyance means comprises two keep plates which are spaced from each other by a distance slightly larger than the thickness of a cassette case and which are secured to a coupling member, and wherein said first conveyance means inserts the cassette case, in which magnetic tape has not yet been wound, into the space between said keep plates.

4. An apparatus as defined in claim 1 wherein said cassette cases returned to said wind-up waiting position are conveyed out of said wind-up waiting position due to gravity.

5. An apparatus as defined in claim 4, wherein said cassette cases returned to said wind-up waiting position are conveyed out of said wind-up waiting position due to gravity slightly before said next cassette case is conveyed to said wind-up waiting position.

6. An apparatus as defined in claim 1, wherein said cassette cases returned to said wind-up waiting position are pushed out of said wind-up waiting position by said first conveyance means while said next cassette case is being conveyed to said wind-up waiting position by said first conveyance means.

7. An apparatus as defined in claim 1, wherein said cassettes are video magnetic tape cassettes.

8. A method of winding a magnetic tape in a plurality of cassette cases which each have a pair of reels to which edges of a leader tape are connected, said method comprising the steps of:
    (a) conveying a first of said plurality of cassette cases in which no magnetic tape has been wound to a wind-up waiting position;
    (b) conveying said first cassette case from said wind-up waiting position to a wind-up position;
    (c) winding magnetic tape into said first cassette case at said wind-up position;
    (d) returning said first cassette case to said wind-up waiting position; and
    (e) substantially simultaneously conveying said returned first cassette case out of said wind-up waiting position and conveying a next one of said plurality of cassette cases in which no magnetic tape has been wound to said wind-up waiting position.

9. A method as defined in claim 8, further comprising the step of performing steps (b) through (e) for said next cassette case.

10. A method as defined in claim 9, further comprising the step of repeating steps (a) through (e) for each of said plurality of cassette cases other than said first and said next cassette cases.

11. A method as defined in claim 8, wherein said cassette cases are conveyed to said wind-up waiting position by a first conveyance means comprising a guide pin and bars which are supported on a common support plate and which grasp the cassette case in which magnetic tape has not yet been wound in order to convey the cassette case to said wind-up waiting position.

12. A method as defined in claim 8, wherein said cassette cases are conveyed between said wind-up waiting position and said wind-up position by a second conveyance means comprising two keep plates which are spaced from each other by a distance slightly larger than the thickness of a cassette case and which are secured to a coupling member, said cassette cases being inserted into the space between said keep plates.

13. A method as defined in claim 8, wherein said cassette returned to said wind-up waiting position are cases returned to said wind-up waiting position out of said wind-up waiting position due to gravity.

14. A method as defined in claim 13, wherein said cassette cases returned to said wind-up waiting position are conveyed out of said wind-up waiting position due to gravity slightly before said next cassette case is conveyed to said wind-up waiting position.

15. A method as defined in claim 8, wherein said cassette cases returned to said wind-up waiting position are pushed out of said wind-up waiting position as said next cassette case is being conveyed to said wind-up waiting position.

16. A method as defined in claim 8, wherein said cassettes are video magnetic tape cassettes.

* * * * *